United States Patent [19]

Cichocki et al.

[11] Patent Number: 4,771,365
[45] Date of Patent: Sep. 13, 1988

[54] PASSIVE COOLED ELECTRONIC CHASSIS

[75] Inventors: Dean M. Cichocki; Steven D. Schwartz, both of Phoenix, Ariz.

[73] Assignee: Honeywell Inc., Minneapolis, Minn.

[21] Appl. No.: 114,999

[22] Filed: Oct. 30, 1987

[51] Int. Cl.$^4$ .............................................. H05K 7/20
[52] U.S. Cl. .................................. 361/387; 165/80.3; 361/412
[58] Field of Search ............... 165/80.3; 361/382, 383, 361/386, 387, 388, 395, 399, 412, 415, 424; 357/81; 174/15 R, 16 R, 16 HS, 35 R, 35 S, 52 PE; 220/4 B; 211/41

[56] References Cited

U.S. PATENT DOCUMENTS

| | | | |
|---|---|---|---|
| 3,593,064 | 7/1971 | Wagner et al. | 361/388 |
| 4,330,812 | 5/1982 | Token | 361/387 |
| 4,339,628 | 7/1982 | Marcantonio et al. | 361/412 |

OTHER PUBLICATIONS

IBM Tech Discl. Bull., vol. 20, No. 5, Oct. 1977, "Thermally Enhanced Module—Package", Arnold, p. 1766.

*Primary Examiner*—G. P. Tolin
*Attorney, Agent, or Firm*—Howard Paul Terry

[57] ABSTRACT

A passive cooled electronic chassis is used in a computer unit, or a display unit, or an actuator unit, or a like unit. The chassis overcomes the problem of the prior art chassis which has an active cooling system with parts that were difficult to operate, maintain and repair. The passive cooled electronic chassis includes an aluminum core member which has an electrical insulator sheet, a printed wiring board which bears against the electrical insulator sheet and which has a set of electrical components that are wired to the board, a housing which has a center wall that has recesses having potting material for receiving and embedding respective electrical components. The chassis provides a first heat flow path from such component through the printed circuit board and electrical insulator sheet and core member and center wall to exterior fins. The chassis also provides a second heat flow path from such component through the potting material and the center wall to the exterior fins.

The housing has an end wall, which is integral with the end of the housing center wall, and which bears against the end of the core member, for the first heat flow path from the core member through the end wall and center wall to the exterior fins.

11 Claims, 4 Drawing Sheets

PASSIVE COOLED ELECTRONIC CHASSIS

BACKGROUND OF THE INVENTION

The invention relates to an electronic chassis, and in particular the invention relates to a closed, passive cooled, electronic chassis having two electronic component boards, each having a first side heat conducting finned metal housing and having a common second side heat conducting metal core member disposed therebetween.

The prior art closed, passive cooled, electronic chassis includes an electronic component board, a housing, and a cold plate extending through the housing for conducting heat away from the board. A second, prior art, active cooled, electronic chassis includes an electronic component board, a housing, and a forced air cooling system.

One problem with the prior art, closed, passive cooled, electronic chassis is the failures in the parts of the cold plate and its related equipment. One problem with the second, prior art, active cooled, electronic chassis is the failures in the parts of the forced air cooling system.

SUMMARY OF THE INVENTION

According to the present invention, an electronic chassis for an electronic unit is provided. The chassis includes a metal core member, a first electrically insulating and thermally conducting sheet on a first side thereof, a second electrically insulating and thermally conducting sheet on a second side thereof, a first printed wiring board abutting the first electrically insulating sheet, a second printed wiring board abutting the second electrically insulating sheet, a first set of components mounted on the first printed wiring board, a second set of components mounted on the second printed wiring board, a first housing which has a center wall that has a set of recesses containing potting material in which the first set of components are embedded, and a second housing which has a center wall that has a set of recesses containing potting material in which the second set of components are embedded.

By using this above described structure and arrangement of an electronic chassis, it overcomes the first problem of failures in the parts of the cold plate and its related equipment, and it overcomes the second problem of failures in the parts of the forced air cooling system.

The above advantages and subsequent description will be more readily understood by reference to the following drawings.

DESCRIPTION OF THE PREFERRED EMBODIMENTS

Figure 1:
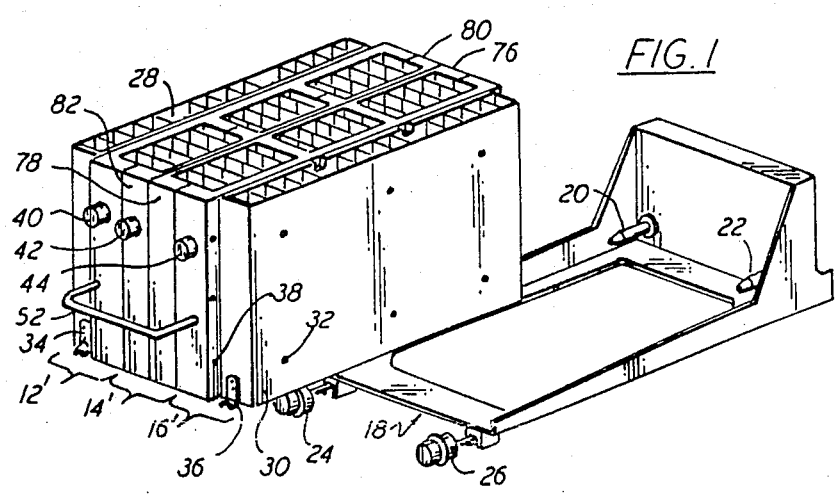
FIG. 1 is a schematic perspective view of a first embodiment of a chassis according to the invention.

In FIG. 1, a computer unit 10 according to the invention is shown. Unit 10 includes a left chassis 12, a middle chassis 14, and a right chassis 16. Chassis 12, 14 and 16 are electronic modules. Unit 10 also includes a holding tray 18. In FIG. 1, tray 18 includes a left support pin 20, a right support pin 22, a left latch portion 24, and a right latch portion 26.

Left chassis 12 has a left cover plate 28. Right chassis 16 has a right cover plate 30, which has machine screws 32. Left chassis 12 has a left latch portion 34. Right chassis 16 has a right latch portion 36. Latch portions 34 and 36 engage respective latch portions 24 and 26.

Figure 3:
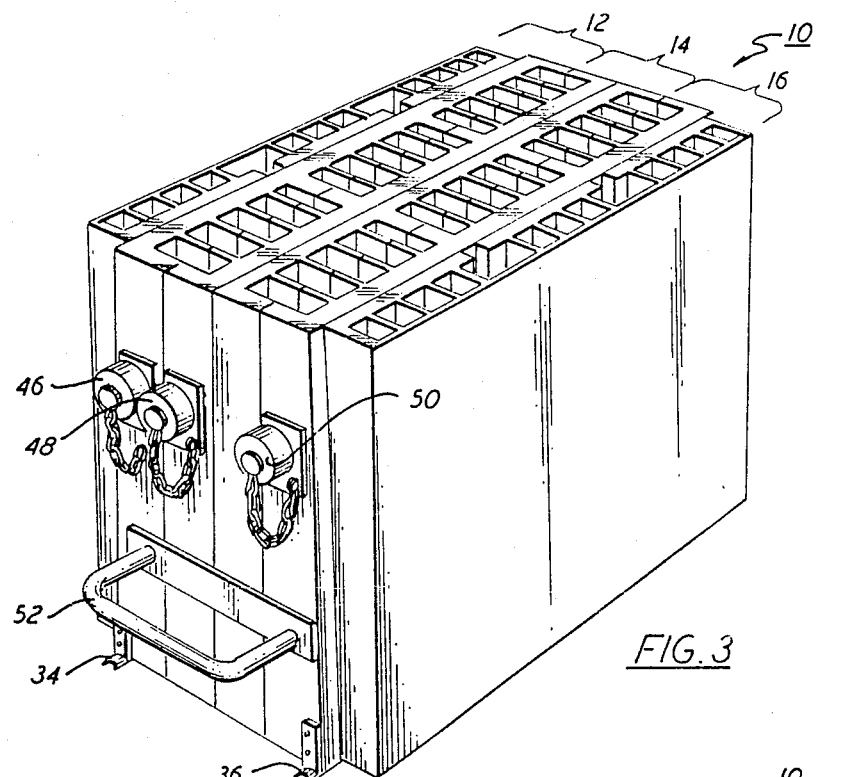
FIG. 3 is a perspective view of an assembled portion of FIG. 1.

Chassis 12, 14 and 16 are joined together by connector screws 38. Chassis 12, 14 and 16 have electrical connectors 40, 42, 44 (FIG. 1), which have respective covers 46, 48, 50 (FIG. 3). Unit 10 also has a handle subassembly 52, as shown in FIGS. 1 and 3.

Figure 2:
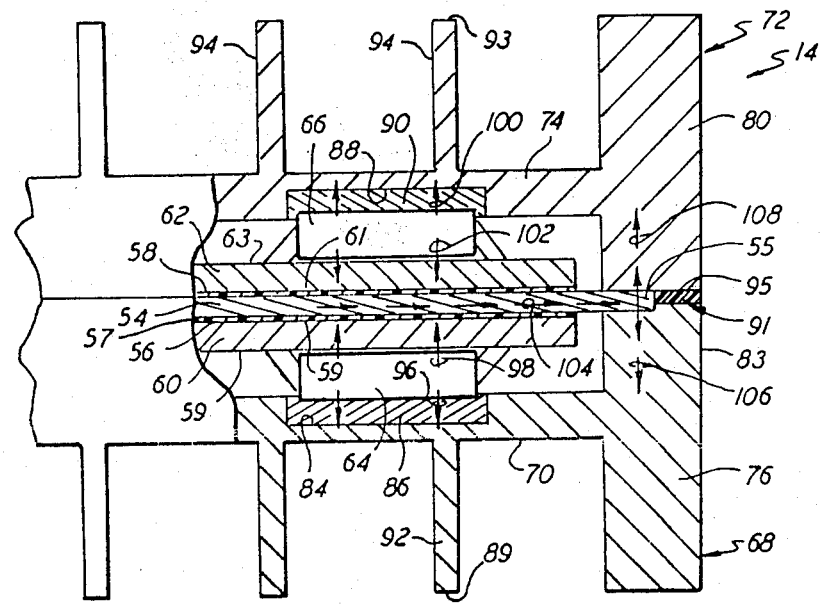
FIG. 2 is a horizontal section view through a portion of FIG. 1.

In FIG. 2, chassis 14, which has substantially the same construction as chassis 12 and 16, includes a core member 54, first insulator sheet 56 and second insulator sheet 58. Sheets 56, 58 are thermally conductive sheets. Core member 54 has an edge portion 55.

Chassis 14 also includes a first printing wiring board 60 and a second printed wiring board 62. First board 60 has an inner face 57 and an outer face 59. Second board 62 has an inner face 61 and an outer face 63. Inner faces 57 and 61 contact the respective sheets 56 and 58. First board 60 has a first set of components 64, mounted on outer face 59. Second board 62 has a second set of components 66, mounted on outer face 63.

In FIG. 2, chassis 14 includes a first housing 68, which has a first center wall 70, and a second housing 72, which has a second center wall 74. First housing 68 has a first rear wall 76 and a first front wall 78. Second housing 72 has a second rear wall 80 and a second front wall 82. First housing 68 has a recess 83, which receives edge portion 55, as shown in FIG. 3.

First center wall 70 has a first set of recesses 84, which contain potting material 86, that receives respective components 64. Second center wall 74 has a second set of recesses 88, which contain potting material 90, that receives respective components 66. First center wall 70 has a first set of spaced fins 92. Second center wall 74 has a second set of spaced fins 94. First set of fins 92 has a first mating surface 89. Second set of fins 94 has a second mating surface 93.

In FIG. 2, the heat flow directions are indicated by arrows. First component 64 has a heat flow in a direction 96 toward fins 92. First component 64 also has a heat flow in a direction 98 toward core member 54. Second component 66 has a heat flow in a direction 100 toward fins 94. Second component 66 has a heat flow in a direction 102 toward core member 54. Core member 54 has a heat flow in a direction 104 toward rear wall 76. Rear wall 76 has a heat flow in a direction 106 away from core member 54. Rear wall 80 has a heat flow in a direction 108 away from core member 54.

Figure 4:
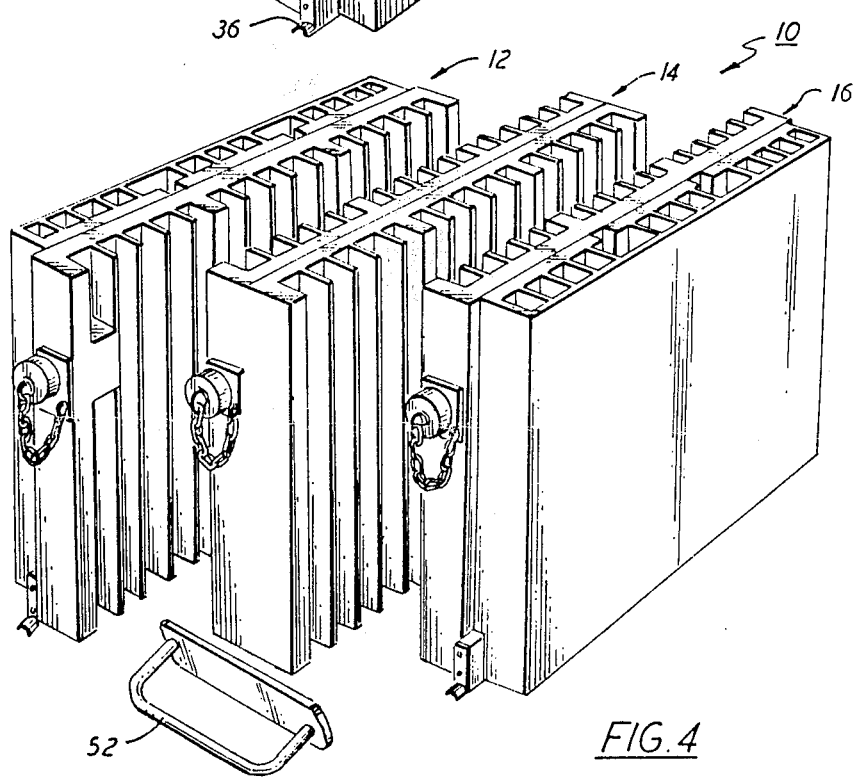
FIG. 4 is a perspective view of a disassembled portion of FIG. 1.
Figure 5:
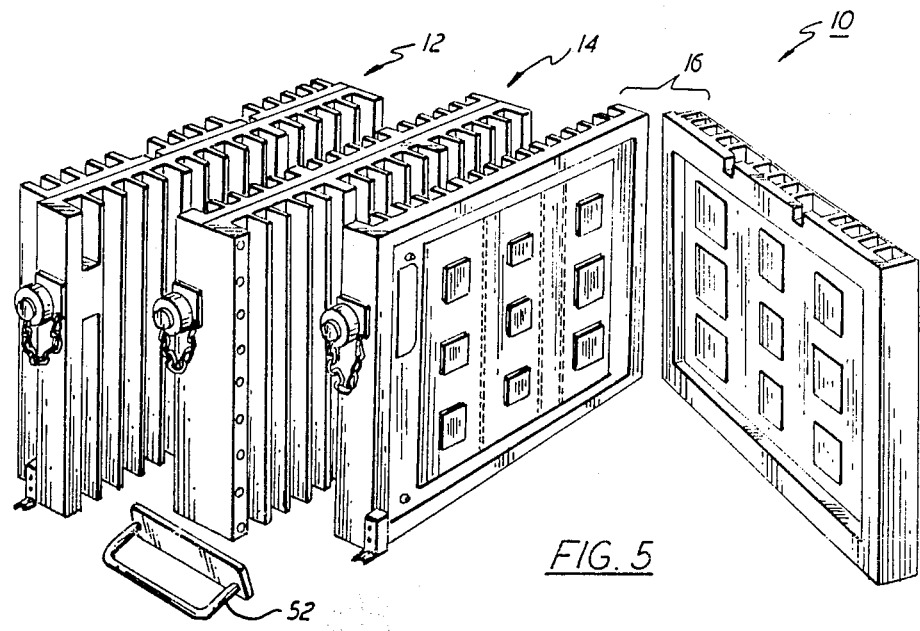
FIG. 5 is a perspective view of a diassembled portion of FIG. 1.

In FIGS. 4 and 5, two disassembled views of unit 10 are shown to better illustrate the construction and assembly of unit 10.

In this embodiment, chassis 14 allows for the use of leaded or leadless components. The function of chassis 14 and the power dissipation of components 64, 66 selected to perform this function dictate the physical size of chassis 14. As can be seen in FIG. 1, several chassis 12, 14, 16 can be bolted together if necessary to acquire the area needed for a particular chassis function. In this embodiment, printed wiring boards 60, 62 are a multilayer glass epoxy construction. Internal planes of copper invar copper are used for expansion control in assemblies which utilize leadless ceramic chip carriers. The two printed wiring boards 60, 62 are mounted back to back to aluminum module core 54.

In this embodiment, electrical insulators 56, 58 are sheets of 0.005 inch glass epoxy which provide isolation between conductive pads on the back of printed wiring board 60, 62 and aluminum module core 54. Core 54 is constructed of 0.063 inch aluminum sheet metal. Core 54 is one half inch larger than printed wiring board 60, 62 on all four sides. The edges of core 54 are sandwiched between the two finned housings 68, 72. The core 54 provides support for the circuit card 60, 62 and a thermal path to carry heat from components 64, 66.

In this embodiment, finned housings 68, 72 are a machined aluminum construction. One side of each housing 68, 72 has machined pockets 84, 88 corresponding to components 64, 66 mounted to printed wiring boards 60, 62. The pockets 84, 88 are filled with thermally conductive potting compound 86, 90 to provide an efficient thermal path from component 64, 66 to its finned housing 68, 72. The opposite side of each housing 68, 72 has machined fins 92, 94 from the top to the bottom of housing 68, 72. To provide free convection air flow, spacing of the cooling fins is maintained at a 0.70 inch minimum. The component junction temperature is directly related to the chassis surface area. The length of fins 92, 94 is determined by the amount of power which components 64, 66 dissipate and the allowable component junction temperature.

In this embodiment, thermally conductive potting compound 86, 90 is used to fill the gap between components 64, 66 and the finned housings 68, 72. Emerson Cuming Eccosil 4952 which is supplied by Dewey Almy Chemical Div. of W. R. Grace Company, Canton, Mass. 02021, was selected based on thermal performance, compliancy, and ease of use. Mold release is used on the finned housing 68, 72 and the top of components 64, 66 to allow for repair. The pockets 84, 88 allow potting compound 86, 90 for an individual component 64, 66 to be removed and remolded if a component 64, 66 itself is replaced. Machine screws 38 are used to secure circuit cards 60, 62 to module core 54 and to secure finned housings 68, 72 together with core 54 sandwiched in between.

Chassis 14 provides substantial convection area, in the form of cooling fins 92, 94 and low thermal resistance conduction paths between components 64, 66 and cooling fins 92, 94. Cooling is achieved by conducting all heat produced by boards 60, 62 and components 64, 66 to cooling fins 92, 94 where it is dissipated to ambient air through free convection. Components 64, 66 are never exposed to ambient air since each chassis 14 is a sealed unit. The bottom side of components 64, 66 conduct heat indirectly to fins 92, 94 via the core 54. Heat is also conducted to fins 92, 94 from the top side of the components 64, 66 through thermally conductive dielectric potting material 86, 90 located in machined pockets 84, 88 above each component. The potting material 86, 90 is molded to the component lids, but a permanent bond is not formed, allowing repair. Moisture and/or E.M.I. protection is provided by gasket 91, which is a resealable resilient gasket, and which is located in a cavity as along the chassis halve's planar mating surface.

In summary, chassis 14 is a closed, non-forced air cooled, chassis which maintains component temperatures at or below those levels achieved with the prior art open forced air chassis. Chassis 14 provides electronics for commercial avionics which meet their stringent, reliability requirements without imposing the penalty of providing a costly electronic cooling system. Chassis 14 provides a low resistance conductive heat path from the top of components 64, 66 to fins 92, 94 because the space between the chassis inside wall 84, 88 and the component 64, 66 contains thermally conductive potting compound 86, 90.

The advantages of chassis 14 are indicated hereafter.

(1) Chassis 14 provides equivalent cooling of components 64, 66 and other electronics without the complexity and cost of forced air cooled designs of the prior art.

(2) Chassis 14 seals the electronics including components 64, 66 from harsh ambient conditions, eliminating related failures.

(3) Chassis 14 electrically isolates components 64, 66 and other electronics from power surges induced by lightning. The thermally conductive potting material 86, 90 which touches the tops of each component 64, 66, and electrical insulator sheet 56, 58, both have relatively high dielectric strengths.

(4) Chassis 14 has few interconnects so as to reduce the risk of related failures.

(5) Chassis boards 60, 62 are rigidly mounted at strategic points to reduce deflections during shock and vibration.

(6) Chassis 14 provides the mechanical medium for maintenance free avionic equipment.

Figure 6:
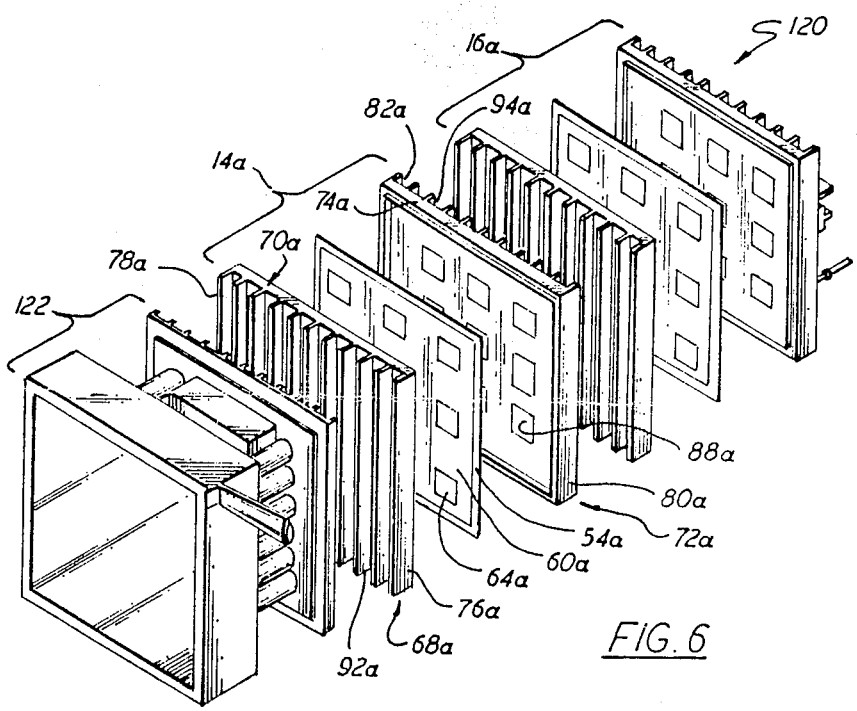
FIG. 6 is a schematic perspective view of a second embodiment of a chassis according to the invention.

In FIG. 6, a second embodiment of a display unit 120 according to the invention is shown. Unit 120 includes a display module 122, a middle chassis 14a and a right chassis 16a. Middle chassis 14a and right chassis 16a have substantially the same mechanical construction.

Parts of unit 120 which are the same as parts of first embodiment 10 have the same numerals, but with a subscript "a" added thereto.

Middle chassis 14a, which has the same type of mechanical construction as middle chassis 14, includes a core member 54a, a first board 60a and a first set of components 64a. Chassis 14a also includes a first housing 68a with a center wall 70a, and a second housing 72a with a center wall 74a. First housing 68a has a first rear wall 76a and a first front wall 78a. Second housing 72a has a second rear wall 80a and a second front wall 82a. Second housing 72a has a second set of recesses 88a and potting material (not shown), for the second set of components (not shown). First housing 68a has a first set of fins 92a. Second housing 72a also has a second set of fins 94a.

In the application of FIG. 6, chassis 14a is used in a display unit 120.

Figure 7:
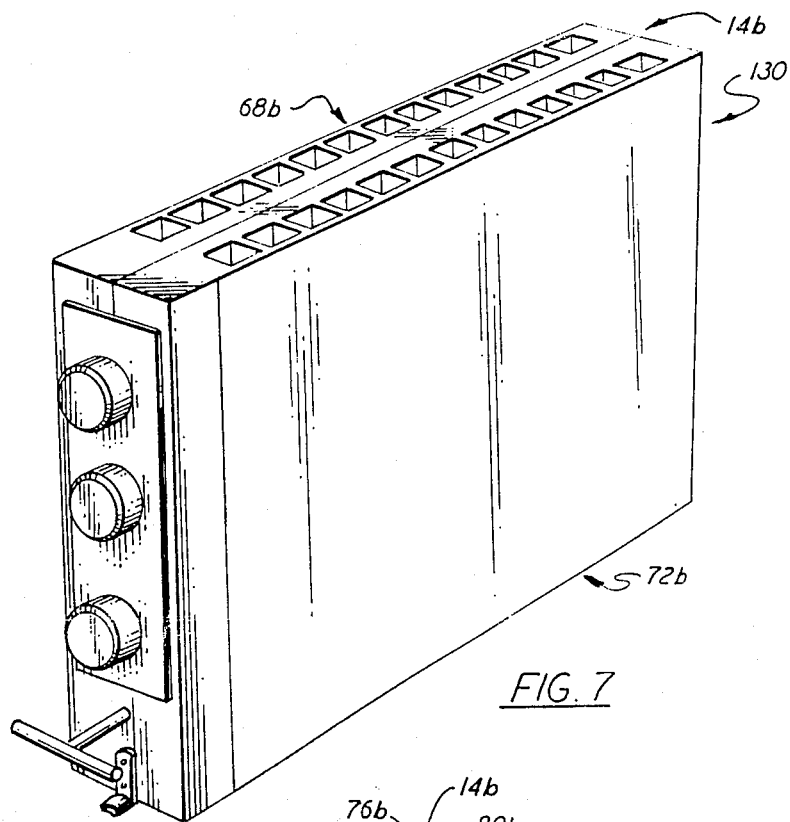
FIG. 7 is a schematic perspective view of a third embodiment of a chassis according to the invention.
Figure 8:
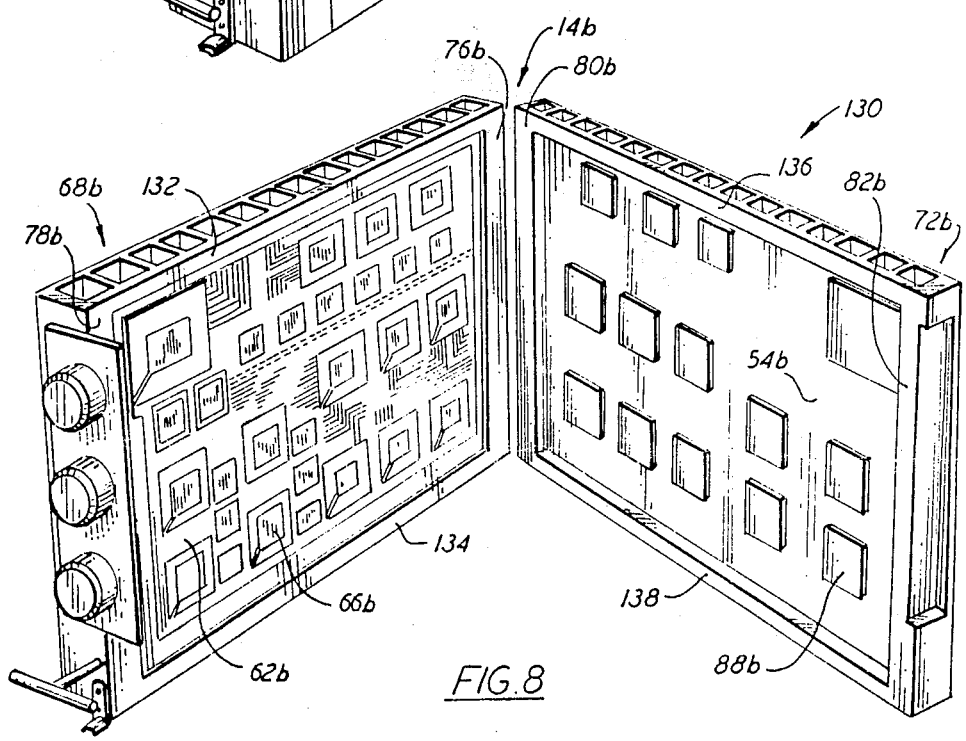
FIG. 8 is a perspective view of the disassembled embodiment of FIG. 7.

In FIGS. 7 and 8, a third embodiment of an actuator control electronic unit 130 is shown. Parts of unit 130 which are the same as parts of the first embodiment 10 have the same numerals, but with a subscript "b" added thereto. Unit 130 includes a chassis 14b. Chassis 14b includes a core member 54b, a first board (not shown) and a second board 62b. Second board 62b has a second set of components 66b. Chassis 14b includes a first housing 68b and a second housing 72b. Second housing 72b has recesses 88b with potting material (not shown), which receive respective components 66b.

First housing 68b has a rear wall 76b, a front wall 78b, a top wall 132 and a bottom wall 134, which enclose first board (not shown). In FIG. 8, top wall 132 is shown; but in FIG. 7, top wall 132 is removed. Second housing 72b also has a rear wall 80b, a front wall 82b, a top wall 136, and a bottom wall 138. In FIG. 8, top wall 136 is shown; but in FIG. 7, top wall 136 is also removed.

Thus, chassis 14 can be used in various applications, such as computer unit 10, or display unit 120, or actuator control unit 130.

While the invention has been described in its preferred embodiments, it is to be understood that the words which have been used are words of description rather than limitation and that changes may be made within the purview of the appended claims without departing from the true scope and spirit of the invention in its broader aspects.

The embodiments of an invention in which an exclusive property or right is claimed are defined as follows:

1. A chassis for an electronic unit comprising:
 a core member which has an edge portion;
 a first electrically insulating and thermally conducting sheet which has an inner face that contacts the core member;
 a first electronic board which has an inner face that contacts the sheet and which has an outer face that has at least one component;
 a first housing which has a first center wall that has a recess containing potting material in which the component is embedded for heat flow directly to the first center wall and which has a first end wall; and
 a second housing which has a second center wall and which has a second end wall that presses the edge portion of said core member against the first end wall for heat flow indirectly from the component through the board and thermally conducting sheet and core member and end walls to the center walls.

2. The chassis of claim 1, further comprising:
 a second electrically insulating and thermally conducting sheet which has an inner face that contacts the core member;
 a second electronic board which has an inner face that contacts the second sheet and which has an outer face that has a second component;
 said second housing center wall having a second recess containing second potting material in which the second component is imbedded for heat flow directly to the second center wall and for heat flow indirectly from the second component through the second board and second thermally conducting sheet and core member and end walls to the center walls.

3. The chassis of claim 2, further comprising:
 a first set of fins integral with the first center wall; and
 a second set of fins integral with the second center wall,
 for heat flow away from the center walls to convection air flow over the fins.

4. The chassis of claim 3, wherein
 said first end wall has a recess for receiving the core edge portion.

5. The chassis of claim 3, wherein
 said first set of fins have a planar mating surface for adjoining another chassis.

6. The chassis of claim 3, wherein
 said housings have a cavity between them to retain an E.M.I./moisture seal to seat against a planar mating surface between the housings.

7. The chassis of claim 3, including
 a holding tray which has support pins and which has latch members;
 a second chassis constructed like the first chassis of claim 1;
 a third chassis constructed like the first chassis of claim 1;
 a plurality of connectors for connecting the second chassis and the third chassis to either side of the first chassis;
 said second chassis and third chassis having portions engaging the support members and the latch members.

8. The chassis of claim 7, wherein
 each chassis has an electrical connector.

9. The chassis of claim 7, including
 a handle subassembly connected to the assembly of chassis.

10. The chassis of claim 3, wherein
 said first housing has a first top wall and a first bottom wall; and
 said second housing has a second top wall and a second bottom wall.

11. The chassis of claim 3, including
 a display module connected to the first housing; and
 a second chassis connected to the second housing.

* * * * *